(12) United States Patent
Chakravarthi et al.

(10) Patent No.: US 12,167,592 B2
(45) Date of Patent: Dec. 10, 2024

(54) 3D MEMORY DEVICE WITH TOP WORDLINE CONTACT LOCATED IN PROTECTED REGION DURING PLANARIZATION

(71) Applicant: INTEL CORPORATION, Santa Clara, CA (US)

(72) Inventors: Nanda Kumar Chakravarthi, Fremont, CA (US); David Meyaard, Albuquerque, NM (US); Abhinav Tripathi, San Jose, CA (US); Liu Liu, Dalian (CN)

(73) Assignee: INTEL CORPORATION, Santa Clara, CA (US)

( * ) Notice: Subject to any disclaimer, the term of this patent is extended or adjusted under 35 U.S.C. 154(b) by 475 days.

(21) Appl. No.: 17/442,582

(22) PCT Filed: Jun. 10, 2019

(86) PCT No.: PCT/CN2019/090513
§ 371 (c)(1),
(2) Date: Sep. 23, 2021

(87) PCT Pub. No.: WO2020/248091
PCT Pub. Date: Dec. 17, 2020

(65) Prior Publication Data
US 2022/0189976 A1    Jun. 16, 2022

(51) Int. Cl.
*H01L 27/11524*    (2017.01)
*H10B 41/20*    (2023.01)
(Continued)

(52) U.S. Cl.
CPC ............. *H10B 41/35* (2023.02); *H10B 41/20* (2023.02); *H10B 43/20* (2023.02); *H10B 43/35* (2023.02)

(58) Field of Classification Search
CPC ........ H10B 41/35; H10B 41/20; H10B 43/20; H10B 43/35; H10B 41/27; H10B 43/27;
(Continued)

(56) References Cited

U.S. PATENT DOCUMENTS 9,520,402 B1 * 12/2016 Haller ................... H01L 23/528
2014/0191389 A1    7/2014 Lee et al.
(Continued)

FOREIGN PATENT DOCUMENTS

| CN | 107564916 A | 1/2018 |
| CN | 107731834 A | 2/2018 |

OTHER PUBLICATIONS

International Search Report and Written Opinion mailed Mar. 10, 2020 for International Application No. PCT/CN2019/090513, 9 pages.

*Primary Examiner* — Shahed Ahmed
(74) *Attorney, Agent, or Firm* — Schwabe, Williamson & Wyatt, P.C.

(57) ABSTRACT

Embodiments of the present disclosure are directed towards a memory device including a top wordline contact located in a region that is protected from erosion during a planarization process, e.g., chemical mechanical polish (CMP). In embodiments, a plurality of wordlines are formed in a stack of multiple layers and a plurality of wordline contacts are formed to intersect with the plurality of wordlines. In embodiments, the stack forms a staircase and each of the plurality of wordline contacts lands on a corresponding each of the wordlines proximate to an edge of the staircase such that a top wordline contact lands in a region on a top wordline previously covered by a sacrificial layer. In some embodiments, the region is proximate to a raised notch at an edge of the staircase. Other embodiments may be described and claimed.

20 Claims, 7 Drawing Sheets

(51) Int. Cl.
*H10B 41/35* (2023.01)
*H10B 43/20* (2023.01)
*H10B 43/35* (2023.01)

(58) Field of Classification Search
CPC .............. H10B 41/50; H10B 43/00–50; H10B 41/00–70; G11C 16/0466–0475; G11C 2216/12–30; H01L 21/3212–32125
See application file for complete search history.

(56) References Cited

U.S. PATENT DOCUMENTS

| | | |
|---|---|---|
| 2015/0115454 A1 | 4/2015 | Magnus et al. |
| 2018/0240811 A1 | 8/2018 | Kim et al. |
| 2020/0251490 A1* | 8/2020 | Matsumoto ......... H01L 23/5226 |
| 2020/0286875 A1* | 9/2020 | Nishida ................... H01L 25/50 |
| 2020/0357815 A1* | 11/2020 | Iwai ....................... H10B 43/27 |

* cited by examiner

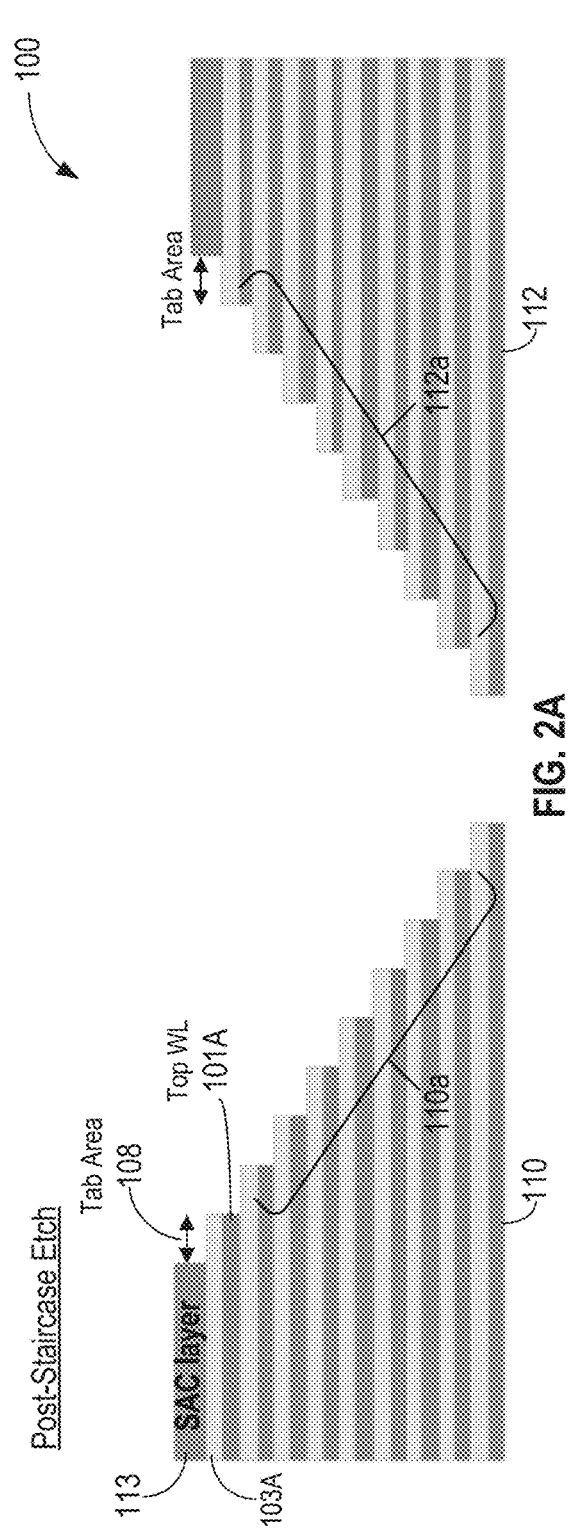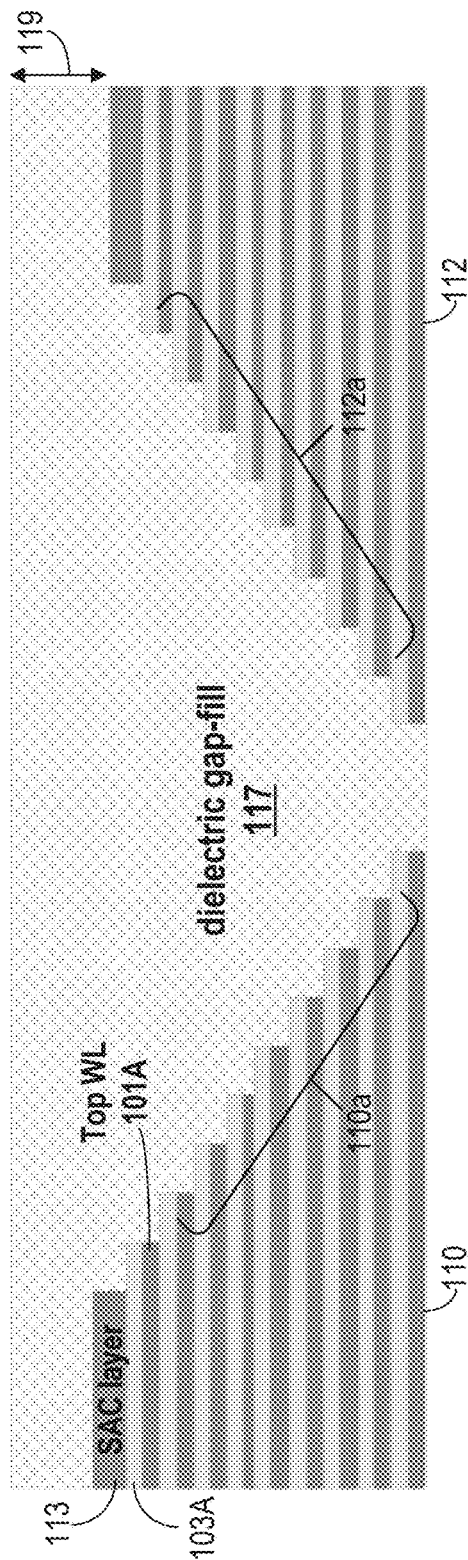

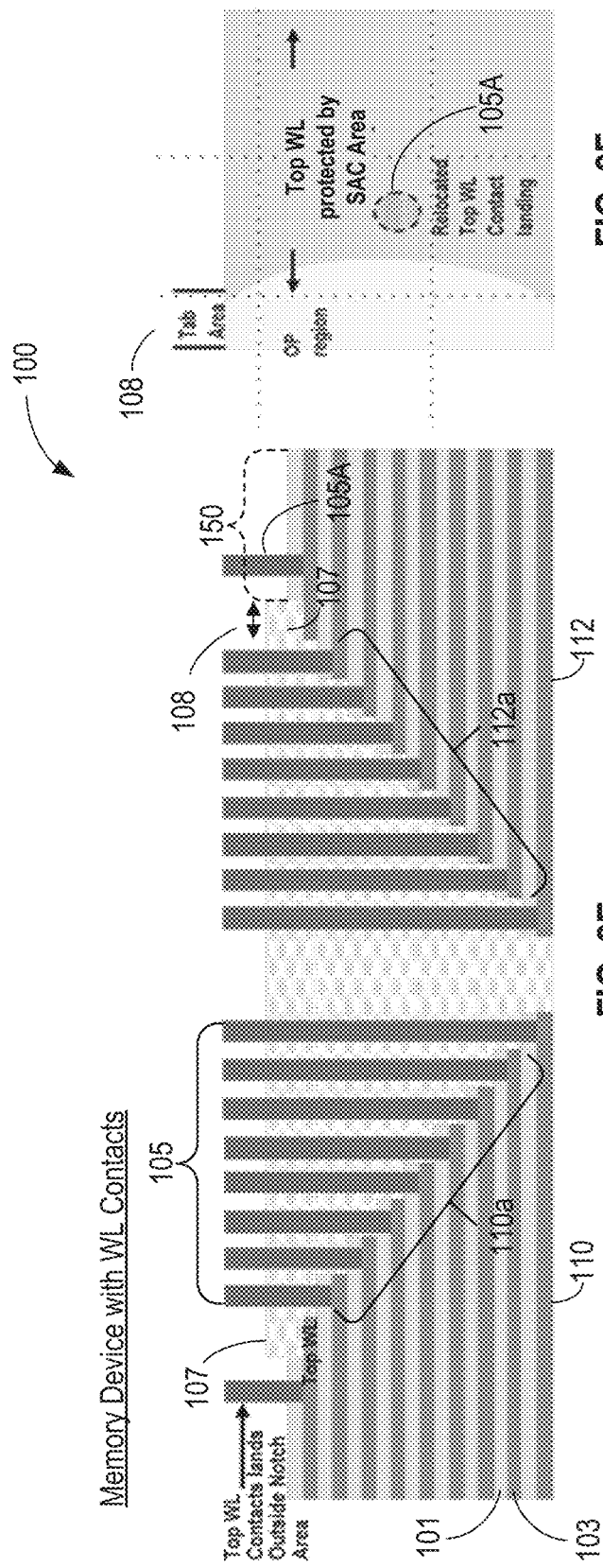

3D MEMORY DEVICE WITH TOP WORDLINE CONTACT LOCATED IN PROTECTED REGION DURING PLANARIZATION

CROSS REFERENCE TO RELATED APPLICATIONS

The present application is a national phase entry under 35 U.S.C. § 371 of International Application No. PCT/CN2019/090513, filed Jun. 10, 2019, entitled "3D MEMORY DEVICE WITH TOP WORDLINE CONTACT LOCATED IN PROTECTED REGION DURING PLANARIZATION", which designated, among the various States, the United States of America, the contents of which is hereby incorporated by reference in its entirety.

FIELD

Embodiments of the present disclosure generally relate to the field of integrated circuits, and more particularly, to fabrication techniques for a non-volatile memory device.

BACKGROUND

A typical flash memory device may comprise a memory array that includes a large number of non-volatile memory cells arranged in row and column fashion. In recent years, vertical memory, such as three-dimensional (3D) memory, has been developed in various forms, such as NAND, NOR, cross-point, or the like. A 3D flash memory array may include a plurality of memory cells stacked over one another. Each group of memory cells may share a plurality of access lines, known as wordlines and bitlines.

Staircase planarization is one of the most critical steps in 3D-NAND fabrication. As technology nodes scale vertically (through an increase in the number of wordline tiers), so does the thickness of dielectric needed to fill the 3D-NAND staircase structures. The dielectric films, however, may be extremely thick and thus challenging to polish due to longer polish times and poor endpoint control across consumable life variations coupled with tight dishing and erosion requirements. The staircase planarization process is among the top bottlenecked steps in NAND high-volume manufacturing (HVM) fabrication plants because the process window may be bound on both the under-polish and overpolish directions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 2A-2E illustrate cross-sectional views of memory device 100 during a process associated with providing the memory device 100 of FIG. 1, in accordance with some embodiments.

FIG. 2F is a top-down view of a portion of the memory device 100 shown in FIG. 2E.

DETAILED DESCRIPTION

Figure 1:
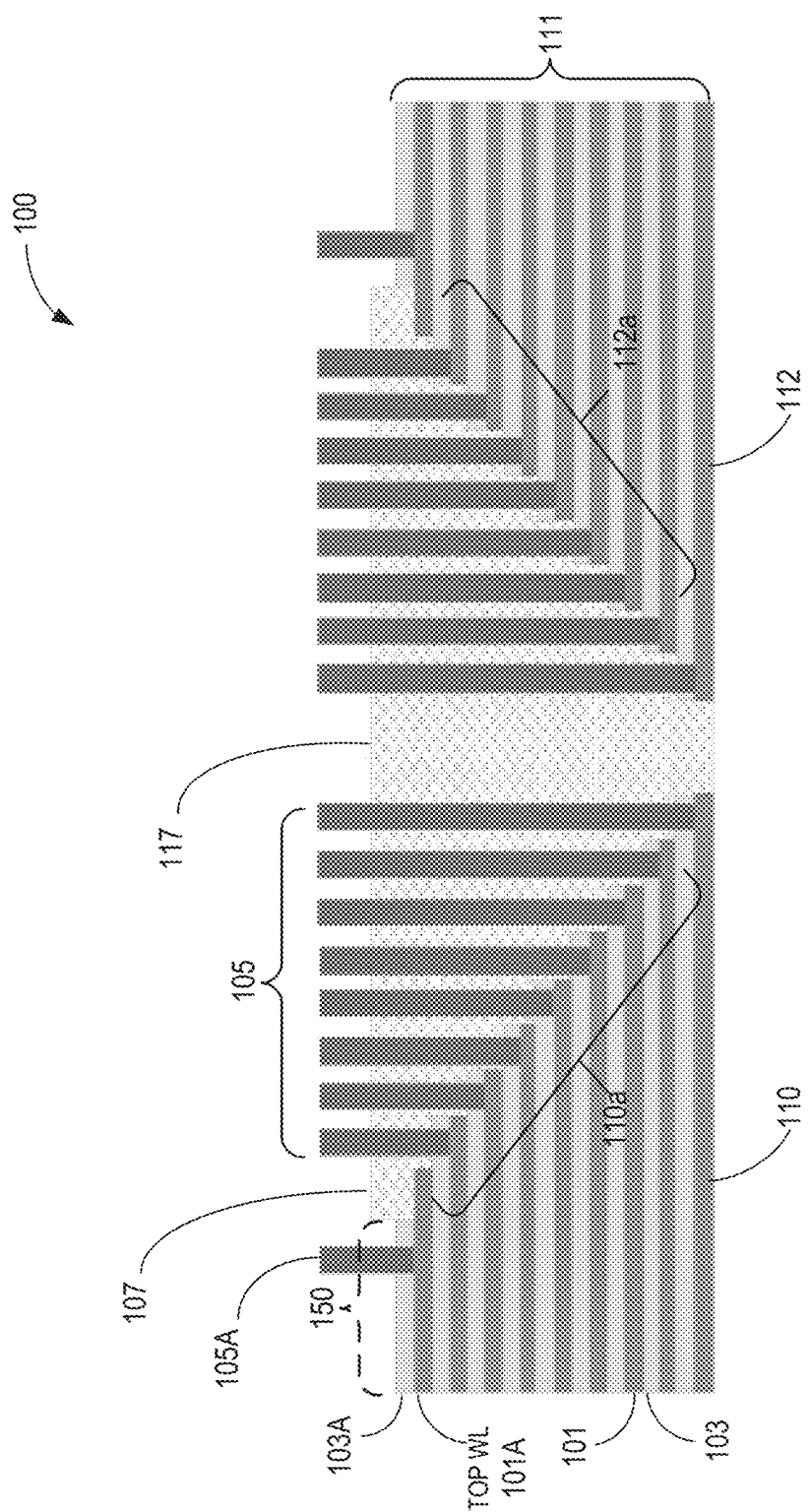
FIG. 1 is an example cross-sectional view of a portion of a memory device 100 including a wordline contact located to land within a region over a top wordline previously covered by a sacrificial layer, in accordance with some embodiments.

Embodiments of the present disclosure describe techniques and configurations for a memory device including a top wordline contact located in a region that is protected from erosion during a planarization process. In embodiments, a first or top wordline is included in a plurality of wordlines formed in a stack of multiple layers and a plurality of wordline contacts are formed to intersect with the plurality of wordlines in a staircase along a side of the stack of multiple layers. In embodiments, a corresponding each of the plurality of wordline contacts lands on a respective each of the wordlines proximate to an edge of the staircase and the top wordline contact lands within a region that is over the top wordline and was previously covered by a sacrificial layer. In embodiments, the top wordline contact is located or relocated away from an area that is unprotected by a sacrificial layer during a planarization process, e.g., a chemical mechanical process (CMP).

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is an example cross-section view of a portion of a memory device 100 including a top wordline contact located in a region that was previously covered by a sacrificial layer, in accordance with some embodiments. In embodiments, the region includes a dielectric layer residing over a top wordline and that was previously covered by a sacrificial layer during a polishing process to planarize the memory device. In embodiments, the region is proximate to a notch 107 located at an edge of the staircase on a first dielectric layer. In embodiments, the memory device 100 is a non-planar device (e.g., 3D) and includes a non-volatile memory device. The memory device 100 may be a flash memory device, such as a NAND flash or a NOR flash memory device, or another kind of memory device, e.g., multilevel cell (MLC) memory device. In embodiments, the memory device 100 may be implemented as an integrated circuit (IC), e.g., in a die.

The memory cells comprising the memory device 100 include non-volatile memory cells, such that the memory cells retain information stored thereon when power is disconnected from memory device 100. In embodiments, the memory device 100 includes memory cells (not shown), which may be arranged in memory cell strings. The memory cells of a given memory cell string share a common channel region. In other words, the memory cells may be physically located in multiple levels of memory device 100, such that the memory cells in the same memory cell string may be stacked over each other in multiple levels of memory device 100, forming pillars (not shown).

In embodiments, portion of memory device 100 includes a first staircase structure 110 and a second staircase structure 112, on respective left and right sides of memory device 100. Note that although two staircases have been illustrated in FIG. 1 and in subsequent Figures, embodiments, however, also include memory devices including only a single staircase and memory devices having two or more staircases. In embodiments, staircase structure 110 includes a staircase 110a, while staircase structure 112 includes a staircase 112a. In embodiments, a fill material, e.g., a dielectric gap-fill material 117, fills a space between first staircase structure 110 and second staircase structure 112. As shown, a plurality of wordlines 101 including, e.g., conductive layers, are formed in a stack of multiple layers 111 (note that staircase 112a mirrors staircase 112b and various similar elements may be labeled interchangeably and only once, for clarity in the Figures). In embodiments, as shown, stack of multiple layers 111 includes each of a plurality of alternating dielectric layers 103 disposed between each of a plurality of conductive layers, which form a plurality of wordlines 101. In embodiments, a plurality of wordline contacts 105 are formed to intersect with the plurality of wordlines 101, where a corresponding each of the plurality of wordline contacts 105 land on a respective each of the conductive layers, that form a wordline (also "WL") 101, proximate to an edge of a staircase 110a.

As will be shown further below, in embodiments, a first or top wordline contact 105A is located to land within a region 150 over a top wordline, e.g., top wordline 101A. In embodiments, a dielectric layer 103A directly over top wordline 101A was previously covered by a sacrificial layer. In embodiments, the sacrificial layer includes any suitable layer that is used to protect underlying layers or structures during a planarization process and that is subsequently removed, e.g., a nitride layer or other suitable CMP stop layer. In embodiments, the planarization process includes a chemical mechanical polish (CMP) process. Note that for clarity in the Figures, only one conductive layer and one dielectric layer has been labeled. Furthermore, as noted above, various similar elements on only one of first staircase structure 110 or second staircase structure 112 may be labeled.

Figure 4:
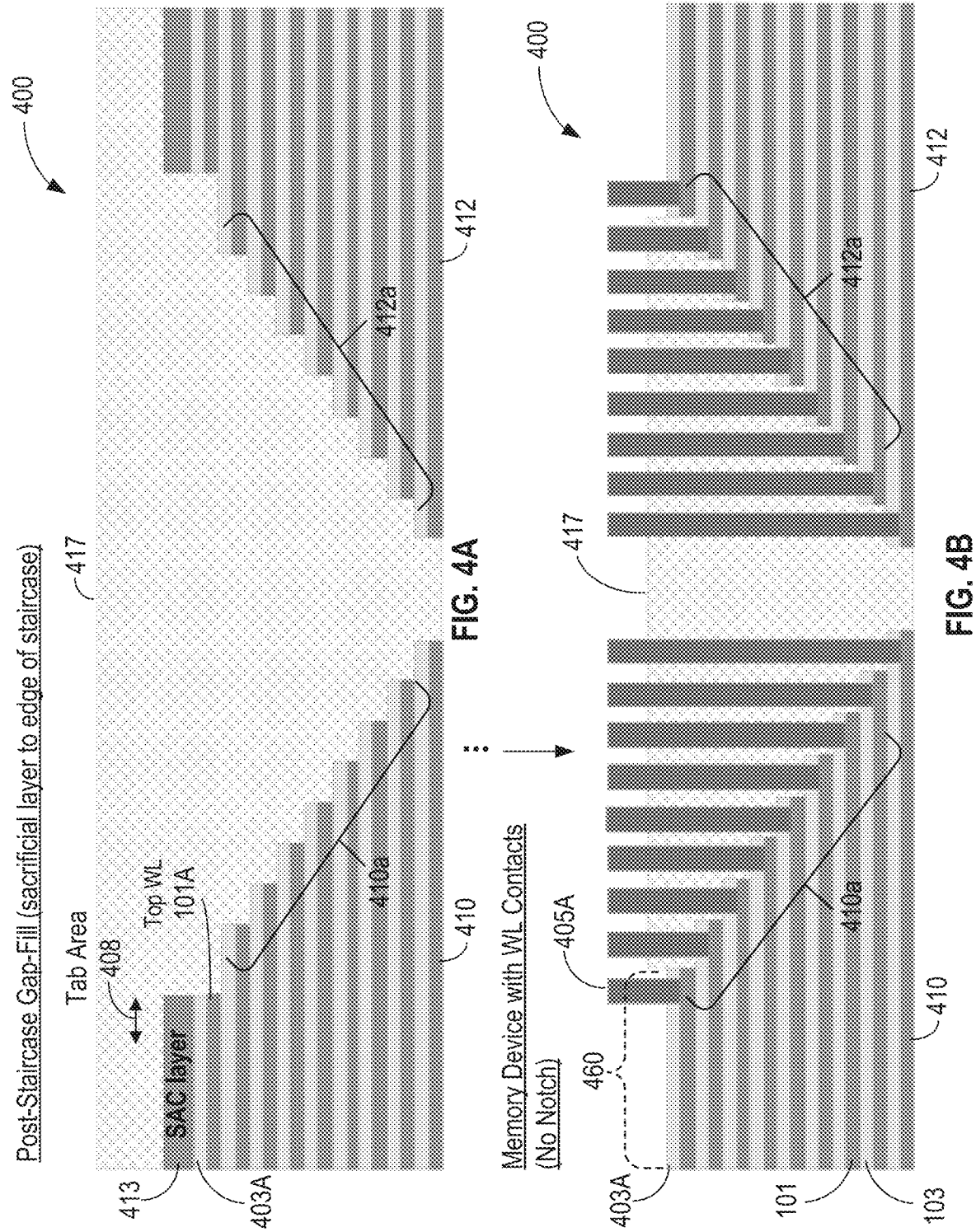
FIGS. 4A and 4B illustrate cross-sectional views of a memory device 400, in accordance with additional embodiments.

In embodiments, the memory device 100 includes plurality of wordlines 101 that carry signals and may form at least part of access lines of memory device 100. In embodiments, the memory device 100 includes data lines or bitlines (not shown) that carry corresponding data signals. In embodiments, a location of a top wordline contact as described in the present disclosure prevents electrical failure of the top wordline contact that can occur due to erosion during a planarization process. Note that conductive layers that form plurality of wordlines 101 and dielectric layers 103 are shown in FIG. 1 as an illustrative example only. The number of these layers may vary and in embodiments, will include multiple wordline tiers. Note furthermore that first and second staircase structures 110 and 112 are shown in the Figures for ease of understanding. As noted above, it should be understood that memory device 100 may have a single staircase or multiple staircases. The staircase structure may be provided by trimming and etching on the wordlines. One of ordinary skill in the art may recognize that memory device 100 (and/or memory device 400 described in connection with FIGS. 4A and 4B) may include other elements, most of which are not shown in FIG. 1 or FIG. 4B, so as not to obscure the example embodiments described herein.

Figure 2C:
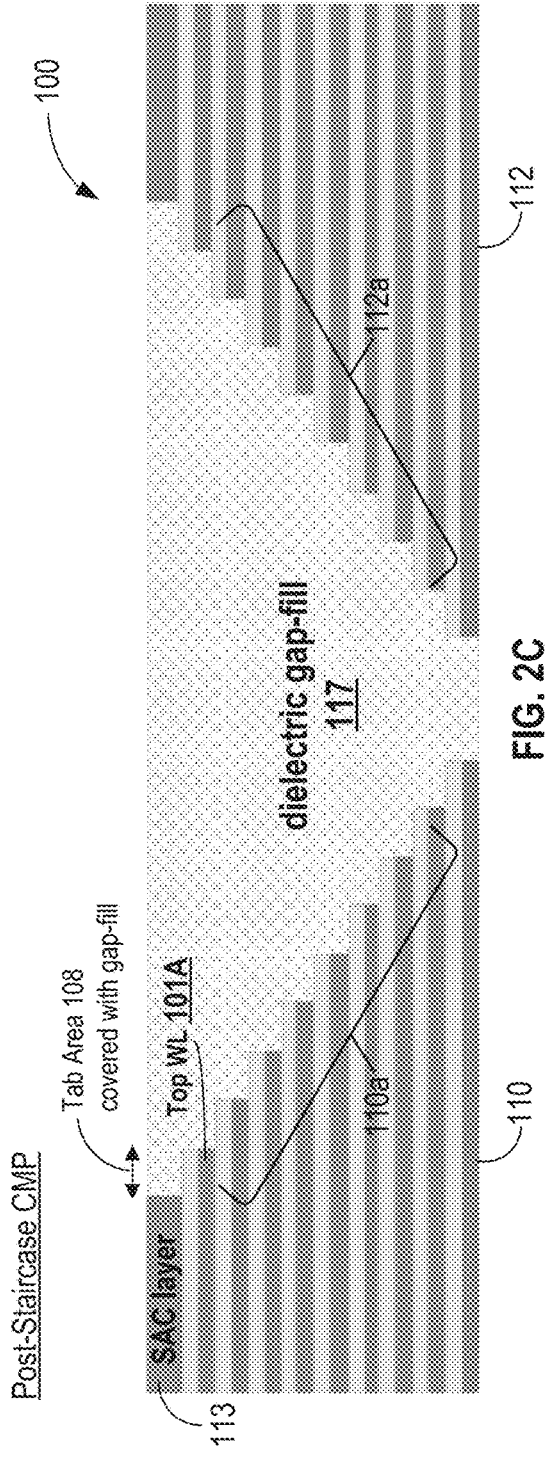

According to embodiments, FIGS. 2A-2F illustrate cross-sectional views of a memory device, e.g., memory device 100 of FIG. 1, in various stages of formation. In embodiments, a process begins by providing a plurality of wordlines in a stack of multiple layers that form a staircase, e.g., first staircase structure 110 and second staircase structure 112. Accordingly, in embodiments, FIG. 2A illustrates a cross-sectional view of a portion of memory device 100 after a staircase 110a and a staircase 112a have been etched (e.g., "post-staircase etch"). In embodiments, as shown, a sacrificial layer 113 is deposited directly over top dielectric layer 103A. In embodiments, top dielectric layer 103A is deposited over a top conductive layer forming top wordline 101A. In embodiments, sacrificial layer 113 covers a top dielectric layer 103A, however, does not extend to an edge of dielectric layer 103A. Accordingly, in embodiments, a tab area 108 including an area without a sacrificial layer is located over dielectric layer 103A proximate to an edge of, e.g., staircase 110a.

Next, in embodiments, as shown in FIG. 2B, a post-staircase gap-fill stage is illustrated, where a gap-fill material or film is deposited between staircase 110a and staircase 112a. In embodiments, the gap-fill material is a dielectric gap-fill material 117 and fills a space between first staircase 110a and second staircase 112a. In embodiments, dielectric gap-fill material 117 includes any suitable insulator material used in similar processes, e.g., oxides, and associated with conventional processes, e.g., chemical vapor deposition (CVD) and atomic layer deposition (ALD), Diffusion and Spin on. In embodiments, dielectric gap-fill material 117 covers first staircase 110a and second staircase 112a as well as sacrificial layer 113. As indicated at 119, dielectric gap-fill material 117 exceeds a height of sacrificial layer 113 disposed on staircase structures 110 and 112. Note that dielectric gap-fill material 117 is well known and includes any suitable insulator material used in processes related to 3D-NAND fabrication and the like.

In FIG. 2C, in embodiments, a post-staircase CMP stage is illustrated. In embodiments, a CMP is applied to memory device 100. In embodiments, dielectric gap-fill material 117 is planarized to have a height even with a top of sacrificial layer 113. Note that in embodiments, tab area 108 is covered and/or otherwise filled with dielectric gap-fill material 117.

Figure 2D:
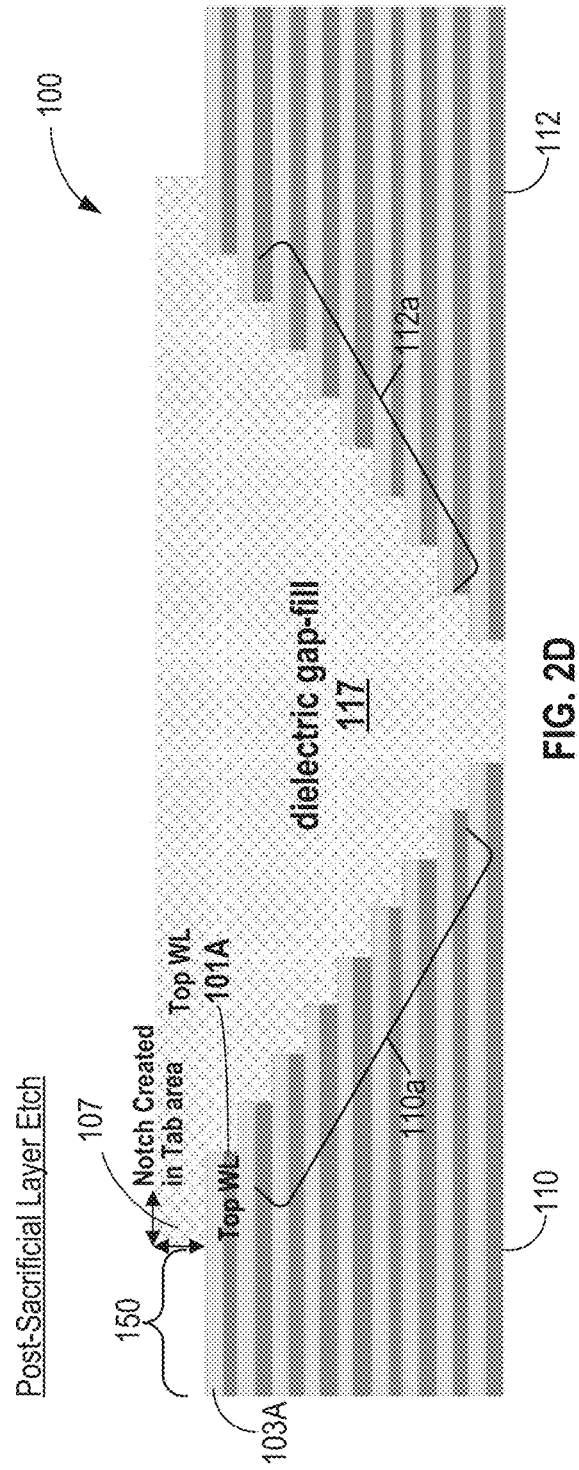

Next, in FIG. 2D, according to embodiments, a raised notch or notch 107 is created during a post-sacrificial layer etch stage. In embodiments, sacrificial layer 113 is etched or otherwise removed, creating a raised notch or notch 107 in tab area 108 proximate to a region 150. Note that in embodiments, any suitable wet etch, dry etch, or other suitable process to remove sacrificial layer 113 is utilized. In embodiments, region 150 is located over the top wordline and was previously covered by sacrificial layer 113. In embodiments, notch 107 resides on dielectric layer 103A and remains after etching and includes dielectric gap-fill material 117.

In FIG. 2E, in embodiments, a top wordline contact 105A is located to land within a region 150 over a top wordline previously covered by a sacrificial layer. In embodiments, top wordline contact 105A lands in a region proximate to notch 107 (now labeled on right staircase 112, for ease of comparison to the top view of FIG. 2F) located at the edge of the staircase on a dielectric layer over top wordline 101A. In embodiments, a plurality of wordline contacts 105, are patterned and/or designed to land on a respective each of a plurality of wordlines 101 proximate to an edge of staircase 101a and/or 112a. To further illustrate, FIG. 2F is a top down view of a portion of the memory device 100, illustrating top wordline contact 105A located in region 150 previously covered or protected by sacrificial layer 113. Note that conventional locations of a top wordline contact 105A may be located within tab area 108. Tab area 108 may be prone to CMP dishing or erosion during a CMP process, frequently creating a wordline-to-wordline contact short. In embodiments, top wordline contact 105A is located to land within a region over a top wordline previously covered by a sacrificial layer, to prevent electrical failure of the top wordline contact due to erosion during a planarization process.

Accordingly, in embodiments, top wordline contact 105A has been relocated to region 150, outside of tab area 108. In embodiments, top wordline contact 105A is relocated to land in an area outside of notch 107. In embodiments, top wordline contact 105A is located or relocated away from an area that is unprotected by a sacrificial layer during the CMP.

Figure 3:
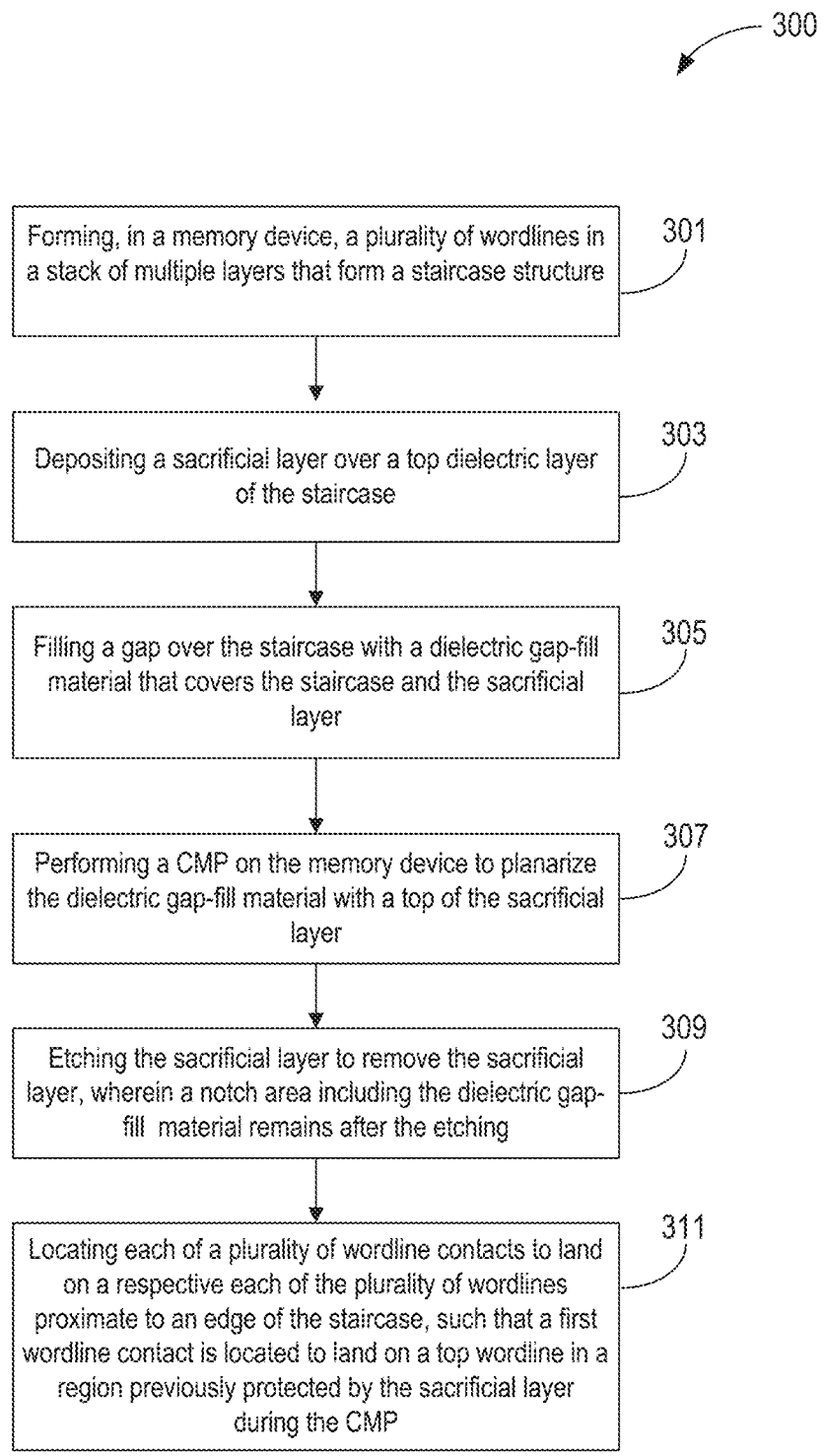
FIG. 3 is an example process flow diagram associated with providing a memory device, e.g., memory device 100, of the present disclosure, in accordance with some embodiments.

Next, FIG. 3 is an example flow diagram of a process 300 for providing the memory device associated with FIG. 1 and FIGS. 2A-2F, in accordance with some embodiments. In embodiments, block 301, may include forming, in a memory device, a plurality of wordlines in a stack of multiple layers that form a staircase. In embodiments, the stack includes a plurality of alternating dielectric layers and conductive layers. In some embodiments, the multiple layers include an oxide-polysilicon-oxide-polysilicon (OPOP) stack. At next a block 303, in embodiments, process 300 may include, depositing a sacrificial layer, e.g., sacrificial layer 113 of FIGS. 2A-2F, over a top dielectric layer, e.g., 103A of FIGS. 2A-2F. In embodiments, the sacrificial layer may be any suitable sacrificial layer (that is subsequently removed) to protect the top dielectric layer and a top wordline beneath the dielectric layer during a polishing, e.g., CMP process.

At next block 305, process 300 may include filling a gap over the staircase with a dielectric gap-fill material that covers the staircase and the sacrificial layer, e.g., as shown in FIG. 3. At a block 307, process 300 includes performing a planarization process or polish, e.g., CMP on the memory device to planarize the memory device. In embodiments, after the planarization, the dielectric gap fill material may be at a uniform or substantially uniform height with a top of the sacrificial layer. Next, at block 309, process 300 includes etching the sacrificial layer to remove the sacrificial layer, where a notch or notch area including the dielectric gap-fill material remains after the etching.

Finally, at block 311, in embodiments, process 300 includes designing or locating each of a plurality of wordline contacts to land on a respective each of the plurality of wordlines proximate to an edge of the staircase, such that a top wordline contact is located to land on a top wordline in a region previously protected by a sacrificial layer during the CMP. In embodiments, process 300 may include patterning and etching locations of the plurality of wordline contacts according to a carbon hardmask or other resist methods. Note that process 300 further includes, e.g., filling the wordline contacts, adding metal routings, etc., and various known methods, to form the wordline contacts. Furthermore, note that as previously mentioned, a conventional location of a top wordline contact may be located on, e.g., the notch area and outside of the region previously protected by the sacrificial layer. Accordingly, in embodiments, a first or a top wordline contact has been relocated to a region that is protected from erosion during a planarization process, e.g., the CMP.

Note that the above operations have been simplified and it is to be understood that various operations have been omitted, in order not to obscure the embodiment and to present process 300 in a manner that is most helpful in understanding the claimed subject matter. Furthermore, the order of description should not be construed as to imply that these operations are necessarily order dependent. It will be appreciated that the sequence of operations associated with the process 300 may vary and/or include other actions in accordance with the present disclosure. As noted, the described embodiments may be implemented in a three-dimensional memory array, such as a 3D NAND memory array.

FIGS. 4A and 4B illustrate cross-sectional views of a memory device 400 associated with an additional embodiment. In embodiments, rather than locating or relocating a top wordline contact 405A to a sacrificial layer area, a sacrificial layer is extended to an edge of the staircase (e.g., staircase 410a and/or 412a) to include top wordline contact 405A. For example, FIG. 4A illustrates memory device 400 during a post-staircase gap-fill stage in a process of forming memory device 400. In embodiments of FIG. 4A, instead of leaving an, e.g., tab area 408 uncovered (as in, e.g., tab area 108 of FIG. 2A), sacrificial layer 413 is extended to an edge of staircase 410a. Accordingly, tab area 408 is covered by sacrificial layer 413 and a top wordline contact 405A is located or remains in region 460 proximate to an edge of the staircase 410a. In embodiments, top wordline contact 405A is in region 460 without a raised notch of gap-fill material (e.g., 107 of FIG. 2D) at the edge of the staircase. Note that descriptions of a post-staircase CMP and sacrificial layer etch stage are not shown, however, are similar in various respects to FIGS. 2C and 2D, with the exception of an extent of sacrificial layer 413. Accordingly, as shown in FIG. 4B, in embodiments, extending sacrificial layer 413 allows top wordline contact 405A to remain in region 460 proximate to an edge of staircase 410a. Note that in embodiments, region 460 includes wordline contact 405A in an area without a raised notch at the edge of the staircase. Furthermore, note that conventional locations of a top wordline contact are typically located on or in a notch located on dielectric layer 103A (e.g., a notch which is not created in the process associated with memory device 400 of FIGS. 4A and 4B).

Figure 5:
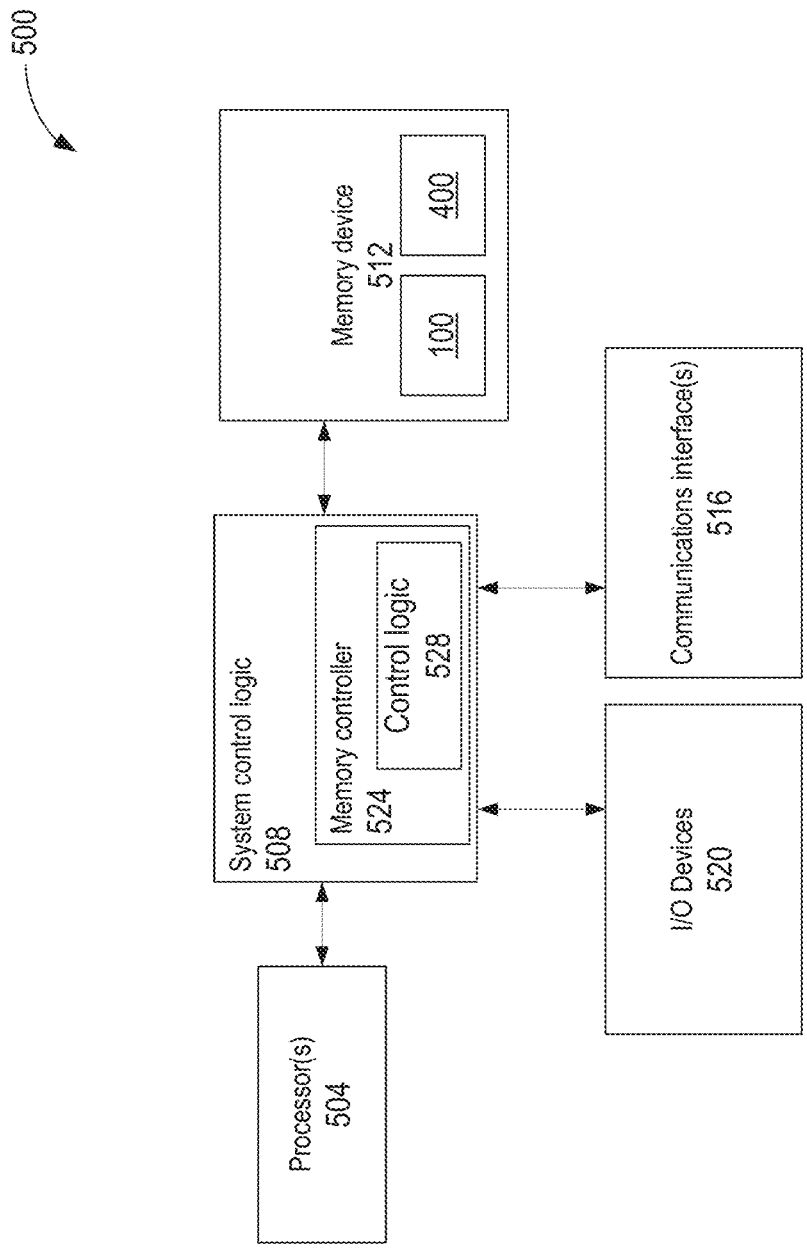
FIG. 5 schematically illustrates an example computing device including the memory device associated with FIGS. 1, 2, and 4, in accordance with some embodiments.

FIG. 5 schematically illustrates an example computing device including a memory device including a top wordline contact located in a region previously covered by a sacrificial layer to protect the top wordline from erosion during a planarization process, in embodiments. In embodiments, the memory device is similar or the same as memory device 100 of FIG. 1 or memory device 400 of FIG. 4B in embodiments. As noted above, in embodiments, the top wordline contact lands within a region over the top wordline previously covered by a sacrificial layer. In some embodiments, the top wordline contact also lands in a region proximate to a raised notch located at the edge of the staircase on a first dielectric layer. In other embodiments, where the sacrificial layer has been extended to an edge of the staircase, the top wordline contact lands in a region proximate to an edge of the staircase without a raised notch. The computing device 500 includes system control logic 508 coupled to one or more processor(s) 504; a memory device 512 having a memory device, e.g., memory device 100 or 400 described in reference to FIGS. 1-4; one or more communications interface(s) 516; and input/output (I/O) devices 520.

The memory device 512 may be a non-volatile computer storage chip (e.g., provided on the die) that may include the memory device 100 or 400 of FIGS. 1-4. In embodiments, the memory device 512 comprises a package, such as an IC assembly having the memory device memory device 100 or 400 disposed therein, driver circuitry (e.g., drivers), input/output connections to electrically couple the memory device 512 with other components of the computing device 500, etc. The memory device 512 may be configured to be removably or permanently coupled with the computing device 500. In embodiments, memory device 512 includes, e.g., a NAND device, e.g. 3D SLC, TLC (triple-level per cell), QLC (quad-level per cell), or SLC NAND device.

In some embodiments, memory device 512 includes any suitable persistent memory e.g., a write-in-place byte addressable non-volatile memory that benefits from embodiments, such as any memory device that scales vertically. In some embodiments, memory device 512 may include any suitable memory that stores data by changing the electrical resistance of the memory cells. In embodiments, memory 512 can include a byte-addressable write-in-place three dimensional crosspoint memory device, or other byte addressable write-in-place NVM device, such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Communications interface(s) 516 may provide an interface for computing device 1200 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 824 to provide an interface to the memory device 512 to control various memory access operations. The memory controller 524 may include control logic 528 that may be specifically configured to control access of the memory device 512.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the computing device 500 may be a mobile computing device such as, but not limited to, a laptop computing device, a tablet computing device, a netbook, a smartphone, etc.; a desktop computing device; a workstation; a server; etc. The computing device 500 may have more or fewer components, and/or different architectures. In further implementations, the computing device 500 may be any other electronic device that processes data.

According to various embodiments, the present disclosure describes a number of examples.

Example 1 is an apparatus, comprising: a plurality of wordlines formed in a stack of multiple layers; and a plurality of wordline contacts formed to intersect with the plurality of wordlines, wherein the stack of multiple layers forms a staircase along a side of the stack and a corresponding each of the plurality of wordline contacts lands on a corresponding each of the wordlines proximate to an edge of the staircase and wherein a top wordline contact is located to land within a region over a top wordline previously covered by a sacrificial layer to protect a top wordline from erosion during a planarization process.

Example 2 includes the subject matter of Example 1, wherein the stack of multiple layers includes a plurality of alternating dielectric layers and conductive layers and the top wordline is a top wordline of the staircase.

Example 3 includes the subject matter of Example 2, wherein the region over the top wordline comprises a region on a first dielectric layer that resides over the top wordline.

Example 4 includes the subject matter of Example 3, wherein the planarization process comprises a chemical mechanical polish (CMP) and a portion of the top wordline underneath the region previously covered by a sacrificial layer is substantially unaffected by CMP erosion during the planarization process.

Example 5 includes the subject matter of Example 1, wherein the top wordline contact lands in a region proximate to a notch located at the edge of the staircase on a first dielectric layer.

Example 6 includes the subject matter of Example 5, wherein the notch comprises a raised portion at the edge of the staircase and incudes a gap-fill dielectric material.

Example 7 includes the subject matter of Example 1, wherein the stack of multiple layers comprises an oxide-polysilicon-oxide-polysilicon (OPOP) stack.

Example 8 includes the subject matter of any one of Examples 1-8, wherein the apparatus comprises a 3D-NAND memory device.

Example 9 is a method, comprising: forming a plurality of wordlines of a memory device, the wordlines included in a stack of multiple layers that form a staircase with alternating conductive layers and dielectric layers; and locating each of a plurality of wordline contacts to land on a respective each of the plurality of wordlines proximate to an edge of the staircase, wherein a first wordline contact is located to land on a top wordline in a region previously protected by a sacrificial layer during a planarization process.

Example 10 includes the subject matter of Example 9, wherein forming the plurality of wordlines of the memory device comprises depositing a sacrificial layer over a top dielectric layer of the staircase.

Example 11 includes the subject matter of Example 10, further comprising filling a gap over the staircase with a dielectric gap-fill material, wherein the dielectric gap-fill material covers the staircase and the sacrificial layer.

Example 12 includes the subject matter of Example 11, further comprising performing a chemical mechanical polish (CMP) to planarize the dielectric gap-fill material.

Example 13 includes the subject matter of Example 12, further comprising etching the sacrificial layer, wherein a raised notch area at an edge of the staircase including the dielectric gap-fill material remains after the etching.

Example 14 includes the subject matter of Example 13, wherein the region previously protected by the sacrificial layer during the planarization process is proximate to the raised notch area.

Example 15 includes the subject matter of any one of Examples 9-14, wherein locating each of a plurality of wordline contacts to land on a respective each of the plurality of wordlines proximate to an edge of the staircase includes patterning and etching a first wordline contact including applying a carbon hardmask.

Example 16 is a computing system, comprising: a processor; and a memory coupled with the processor, wherein the memory includes: a plurality of wordlines formed in a stack of multiple layers; and a plurality of wordline contacts formed to intersect with the plurality of wordlines, wherein the stack of multiple layers forms a staircase along a side of the stack and a corresponding each of the plurality of wordline contacts land on a respective each of the wordlines proximate to an edge of the staircase and wherein a first wordline contact lands within a region over the top wordline previously covered by a sacrificial layer.

Example 17 includes the subject matter of Example 16, wherein the stack of multiple layers includes a plurality of alternating dielectric layers and conductive layers and the top wordline is a top wordline on the staircase.

Example 18 includes the subject matter of Example 16, wherein the region over the top wordline comprises a region on a first dielectric layer that resides over the top wordline.

Example 19 includes the subject matter of computing system of Example 16, wherein the first wordline contact lands in a region between a raised portion between the edge of the staircase and in the region previously covered by the sacrificial layer.

Example 20 includes the subject matter of Example 16, wherein the computing system is a mobile device.

Example 21 includes the subject matter of Example 20, comprising: forming a plurality of wordlines in a stack of multiple layers to form a staircase with alternating layers of conductor and dielectric; and coupling each of a plurality of wordline contacts to land on a respective each of the plurality of wordlines proximate to an edge of the staircase, wherein a first wordline contact is located to land on a first wordline in a region inside of an area proximate to the edge of the staircase and previously protected by a sacrificial layer.

Example 22 includes the subject matter of Example 21, wherein the sacrificial layer is to be subsequently removed.

Example 23 includes the subject matter of any one of Examples 21 and 22 further comprising etching the sacrificial layer, wherein a raised notch area at an edge of the staircase including a dielectric gap-fill material remains after the etching.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a plurality of conductive layers formed in a stack of multiple layers, wherein: the plurality of conductive layers comprise word lines, alternate with dielectric layers in the stack, and include a top conductive layer, the dielectric layers include a top dielectric layer on the top conductive layer, and the stack of multiple layers forms a staircase;
a gap-fill dielectric material adjacent to an edge of the staircase, wherein the gap-fill dielectric material extends upward along the edge of the staircase, and inward from the edge of the staircase on the top dielectric layer, terminating at a notch which defines an edge of a landing region; and
a plurality of contacts formed to intersect with the plurality of conductive layers, wherein respective contacts of the plurality of contacts land on a corresponding conductive layer of the plurality of conductive layers, and a first contact of the plurality of contacts lands on the top conductive layer in the landing.

2. The apparatus of claim 1, wherein a portion of the top conductive layer in the landing region is substantially unaffected by erosion from a planarization process of the stack.

3. The apparatus of claim 1, wherein the first contact lands on the top conductive layer in the landing region at a location spaced apart from the notch.

4. The apparatus of claim 1, wherein the stack of multiple layers comprises an oxide-polysilicon-oxide-polysilicon (OPOP) stack.

5. The apparatus of claim 1, wherein the apparatus is a 3D-NAND memory device.

6. The apparatus of claim 1, wherein a distance between the first contact and a corresponding edge of the staircase is greater than distances between other contacts of the plurality of contacts and corresponding edges of the staircase.

7. The apparatus of claim 6, wherein the distances between the other contacts of the plurality of contacts and the corresponding edges of the staircase are uniform.

8. The apparatus of claim 1, wherein the gap-fill dielectric material covers a tab area of the top dielectric layer which extends from the edge of the staircase to the notch.

9. The apparatus of claim 1, wherein the notch comprises a vertical wall of the gap-fill dielectric material.

10. The apparatus of claim 1, wherein the landing region is not covered by the gap-fill dielectric material.

11. The apparatus of claim 1, wherein edges of adjacent pairs of conductive layers and dielectric layers in the stack are aligned at the edge of the staircase.

12. A computing system, comprising:
a processor; and
a memory coupled with the processor, wherein the memory includes:
a plurality of conductive layers in a stack of multiple layers, wherein the plurality of conductive layers comprises word lines and includes a top conductive layer and other conductive layers; and
a plurality of contacts to intersect with the plurality of conductive layers, including a first contact for the top conductive layer and other contacts for the other conductive layers, and wherein:
the stack of multiple layers comprises a staircase along a side of the stack;
the first contact lands on the top conductive layer;
the other contacts land on respective ones of the other conductive layers proximate to an edge of the staircase; and
a distance between the first contact and an edge of the top conductive layer at the edge of the staircase is greater than distances between the other contacts and corresponding edges of the other conductive layers at the edge of the staircase.

13. The computing system of claim 12, wherein the stack of multiple layers includes a plurality of dielectric layers alternating with the conductive layers.

14. The computing system of claim 12, further comprising a top dielectric layer on the top conductive layer, wherein:
the top dielectric layer—comprises a portion adjacent to the edge of the staircase and a portion non-adjacent to the edge of the staircase;
the portion of the top dielectric layer which is adjacent to the edge of the staircase is covered by a gap-fill dielectric material;
the portion of the top dielectric layer which is non-adjacent to the edge of the staircase is not covered by the gap-fill dielectric material; and
the first contact passes through the portion of the top dielectric layer which is non-adjacent to the edge of the staircase to land on the top conductive layer.

15. The computing system of claim 14, wherein the gap-fill dielectric material which covers the portion of the top dielectric layer which is adjacent to the edge of the staircase terminates at a vertical wall which is spaced apart from the edge of the staircase.

16. The computing system of claim 12, wherein the computing system is a mobile device.

17. An apparatus, comprising:
a plurality of conductive layers in a stack of multiple layers, wherein the conductive layers comprise word lines and alternate with dielectric layers in the stack, the plurality of conductive layers include a top conductive layer and other conductive layers, the dielectric layers include a top dielectric layer on the top conductive layer, and the stack of multiple layers comprises a staircase along a side of the stack; and
a plurality of contacts that intersect with the plurality of conductive layers, including a first contact for the top conductive layer and other contacts for the other conductive layers; wherein:
the first contact lands on the top conductive layer;
the other contacts land on respective ones of the other conductive layers proximate to an edge of the staircase; and
a distance between the first contact and the edge of the staircase at the top conductive layer is greater than distances between the other contacts and the edge of the staircase at corresponding ones of the other conductive layers.

18. The apparatus of claim 17, wherein the distances between the other contacts and the edge of the staircase at the corresponding ones of the other conductive layers are uniform.

19. The apparatus of claim 17, further comprising a gap-fill dielectric material adjacent to the edge of the staircase, wherein the gap-fill dielectric material extends upward along the edge of the staircase, and inward from the edge of the staircase on the top dielectric layer, terminating at a notch before the first contact.

20. The apparatus of claim 17, wherein:
- the top dielectric layer comprises a portion adjacent to the edge of the staircase and a portion non-adjacent to the edge of the staircase;
- the portion of the top dielectric layer which is adjacent to the edge of the staircase is covered by a gap-fill dielectric material;
- the portion of the top dielectric layer which is non-adjacent to the edge of the staircase is not covered by the gap-fill dielectric material; and
- the first contact passes through the portion of the top dielectric layer which is non-adjacent to the edge of the staircase to land on the top conductive layer.

* * * * *

UNITED STATES PATENT AND TRADEMARK OFFICE
CERTIFICATE OF CORRECTION

PATENT NO. : 12,167,592 B2
APPLICATION NO. : 17/442582
DATED : December 10, 2024
INVENTOR(S) : Nanda Kumar Chakravarthi et al.

It is certified that error appears in the above-identified patent and that said Letters Patent is hereby corrected as shown below:

In the Claims

Column 11
Line 39, Claim 1 "the top conductive layer in the landing." should read --the top conductive layer in the landing region.--

Column 12
Line 30, Claim 14 "the top dielectric layer—comprises…" should read --the top dielectric layer comprises…--

Signed and Sealed this
Twenty-fifth Day of February, 2025

Coke Morgan Stewart
*Acting Director of the United States Patent and Trademark Office*